3,487,764

PHOTOTHERMOGRAPHIC PROCESS AND ELEMENT

Douglas G. Borden and Jack L. R. Williams, Rochester, N.Y., assignors to Eastman Kodak Company, Rochester, N.Y., a corporation of New Jersey
No Drawing. Filed Dec. 14, 1966, Ser. No. 601,533
Int. Cl. G03c *5/24, 11/12, 1/70*
U.S. Cl. 96—28 20 Claims

ABSTRACT OF THE DISCLOSURE

Photothermographic elements, and processes of reproducing images therewith, are described which comprise a support and a photoisomerizable compound the softening or tackifying point of which is lowered by exposure to actinic radiation, thus permitting toning or transfer of material from exposed areas of the element.

This invention relates to novel photothermographic processes and to novel elements useful in such processes.

The term photothermographic refers to the production of a graphic image by means involving action of both light and heat.

Graphic reproduction processes are known which involve use of a support coated with a film of material, the solubility characteristics of which are altered by action of actinic light. In such processes, the light sensitive film is first exposed to a light pattern and then washed with a solvent which selectively dissolves and removes only exposed areas, or only unexposed areas, of the film, leaving a pattern of undissolved film on the matrix.

Other known graphic reproduction processes utilize a coating which contains a photopolymerizable or photooligomerizable compound capable of autogenic conversion to a higher melting noncrystalline product when exposed to light. Such a process is described in U.S. Patent No. 1,965,710 issued to Alexander Murray wherein the use of such a compound is described in the preparation of photomechanical resists.

It is an object of the present invention to provide novel coated elements having a light sensitive coating, the softening or tackifying characteristics of which are altered by exposure to actinic radiation.

It is another object of this invention to provide novel photothermographic processes useful for the production of graphic images.

It is still another object of this invention to provide a novel process for the production of a graphic image wherein a photothermographic element containing a light-sensitive material is exposed to actinic radiation in an imagewise manner, the element is heated to a temperature above the softening or tackifying point of the light-sensitive material in the exposed area and below its softening point in the unexposed area, and then the softened isomer is transferred to a receiving sheet.

These and other objects and advantages will appear from the following detailed description.

According to the present invention a photographic element is provided comprising a coated layer of material comprising a photoisomerizable compound whose melting point is lowered by exposure to actinic light. By exposing this film to a light pattern, image areas are formed which soften or become sensually tacky at a temperature substantially lower than that of the unexposed background areas. Then by heating the exposed film to a temperature above the softening point of the image areas and below the softening point of the background areas, a tacky image is produced on the matrix. This tacky image can be developed in situ by the use of toner particles or dyes, or the tacky softened material in image areas can be transferred to a receiving sheet to form a printed image, the non-image areas being less tacky and do not transfer.

Presence of a photoisomerizable compound in the coated material accounts for the functional decrease of melting point or tackifying point by action of light. The photoisomerizable compound, when exposed to light, undergoes transition to a geometric isomer having a lower melting or tackifying point. The isomer formed in the exposed area has a melting or tackifying point substantially lower than the melting or tackifying point of the unexposed photoisomerizable compound, and thus causes a change in the softening or tackifying characteristics of exposed areas of the element.

Photoisomerizable compounds useful according to the present invention are solid at room temperatures and, upon exposure to light, undergo transition to an isomer having a substantially reduced melting or tackifying point. The melting point of the compounds should be such that they do not soften, melt, or become sensually tacky at temperatures normally encountered during transportation or storage. Tackifying points above about 40° C. are suitable, and tackifying points above about 50° C. are preferred. The softening or tackifying point of the isomer should be at a temperature below that at which the support begins to char. Temperatures in the range of about 40 to 200° C. are typical of the tackifying temperatures of such photoisomerizable materials, such temperatures thus being useful in thermographic processes utilizing such materials. This does not preclude the possible occurrence of other photochemical reactions, such as photooxidation or photoreduction, which can play a part in the imagewise reduction of the softening or tackifying point of the element.

Among the photoisomerizable compounds useful in the practice of the present invention, are those having the formula:

(I)

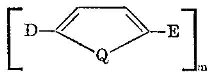

where *m* is an integer of 1 to 2; Q is a —CH=CH—, —S—, —O—, or a >N—R radical, R being a hydrogen atom or a lower alkyl group of 1 to 8 carbon atoms such as methyl, ethyl, propyl, hexyl, octyl, etc.; D is a $$R''-\overset{R'''}{\overset{|}{C}}=\underset{\underset{R'}{|}}{C}(CH=CH)_n-$$

radical where *n* is an integer of 0 to 2, R' is a hydrogen atom or a lower alkyl group as defined for R, R'' is a chlorocarbonyl, an alkyloxycarbonyl, a cyano, an azidocarbonyl, a substituted or unsubstituted aryl radical such as phenyl, tolyl, nitrophenyl, benzoyl, naphthyl, etc., or a heterocyclic radical having a nucleus of 5 or 6 atoms at least one of which is an N, S, or O atom, such as pyridyl, furanyl, pyrrolyl, thiofuranyl, etc., R''' is a hydrogen atom, a cyano or a lower alkyl radical as defined for R; when *m* is 2 each D is joined by a single covalent bond; E is a hydrogen atom, a lower alkyl as defined for R, a nitro, or a D radical.

Typical photoisomerizable compounds of Formula I that can be used in the invention include: trans-2-styrylpyridine, trans-4-styrylpyridine, trans-stilbene, trans-p'-ethylchalcone, trans-2-styrylfuran, trans-2-styrylthiophene, trans - 1 - methyl-2-styrylpyrrol, trans-1,2-difurylethylene, trans,trans-2,5-distyrylthiophene, trans,trans-2,5-distyrylfuran, trans,trans-1-methyl-2,5-distyrylpyrrol, cinnamylideneacetylchloride, 1,1-dicyano-4-phenyl-1,3-butadiene, 1,1-dicyano-2-methyl-4-phenyl-1,3-butadiene, 1,1-dicyano-2-methyl-4-(p-methylphenyl)-1,3-butadiene, cinnamylideneacetylazide, 1-(4'-nitrobenzoyl)-4-phenyl-1,3-butadiene, ethylenebis(styrylacrylate), and butylenebis(styrylacrylate).

A preferred class of photoisomerizable compounds useful in the present invention has the formula:

$$\text{(II)}\qquad \left[R_1O\overset{O}{\overset{\|}{C}}-(\overset{R_2}{\overset{|}{C}}=\overset{R_3}{\overset{|}{C}}-)_m\right]_n Z$$

where $R_1$ is a straight or branched chain alkyl radical having 1–18 carbon atoms and preferably 1–8 carbon atoms such as ethyl, propyl, hexyl, octyl, dodecyl, etc.; $R_2$ and $R_3$ are each independently hydrogen atoms, cyano or lower alkyl radicals as defined above; Z is a substituted or unsubstituted aryl radical as defined in Formula I or a heterocyclic radical having a nucleus or 5 or 6 atoms at least one of which is N, S or O, as defined in Formula I; $n$ is an integer of 1 to 2, and $m$ is an integer of 1 to 5; when $n$ is 1, Z is monovalent, and when $n$ is 2, Z is divalent.

Typical photoisomerizable compounds of Formula II that can be used in the invention include: diethyl p-phenylenediacrylate, dibutyl p-phenylenediacrylate, 1-cyano-1-carbomethoxy-2-methyl-4-phenyl-1,3-butadiene, 1-cyano-1-carbethoxy-2-methyl-4-phenyl-1,3-butadiene, 2 ethylhexyl - 2 - cyano-5-(4-nitrophenyl)-2,4-pentadieneoate, 2 ethylhexyl-2-cyano-5-(2-furyl)-2,4-pentadieneoate, bis(2-ethylhexyl) 5,5'-(p-phenylene) bis (2-cyano-2,4-pentadieneoate), diethyl 5,5'(p-phenylene) bis (2,4-pentadieneoate), bis(2-ethylhexyl 7,7'-(p-phenylene) bis (cyano-2,4,6-heptatrieneoate), and 2-ethyloctyl 4-(β-benzoylvinyl)cinnamate.

The photoisomerizable compounds of our invention are preferably coated on a support in a film-forming thermoplastic polymeric vehicle. Typical examples of suitable thermoplastic polymers which can be used as vehicles for making the photosensitive layer are: olefinic polymers and copolymers such as polyethylene, polystyrene, butadiene-styrene copolymers, poly(ethyleneoxides), poly (vinylchlorides), poly(vinylacetate), poly(vinylchloride-acetate) copolymer, poly(ethylene-vinyl-acetate)copolymer, poly(vinylacetals), copolymers of vinylidene chloride with such monomers as vinyl acetate, acrylonitrile and ethyl acrylate, and polyacrylate and methacrylate esters such as poly(ethyl acrylate) and poly(butyl methacrylate); polyesters and copolyesters of glycols and dibasic acids such as terephthalic, isophthalic, sebacic and adipic acids; cellulose esters such as cellulose acetate and cellulose acetate butyrate; and cellulose ethers such as methoxy ethyl cellulose.

The ratio of light-sensitive material to resin vehicle can be varied over a wide range. Operable ratios include one part light-sensitive material to zero part resin vehicle up through one part light-sensitive material to 80 parts resin vehicle. Ratios of light-sensitive material to resin of 1/0.2 to 1/70 are preferred, and ratios of 1/40 to 1/70 are especially preferred.

The thermoplastic resin vehicle for the photosensitive layer may comprise mixtures of thermoplastic resins, for example, mixtures comprising two or more resins of the types listed above. Viscosity and tackiness may be adjusted by selection of polymers and by addition of plasticizers, fillers, and the like according to techniques well known in the art.

In some embodiments a sensitizer can be incorporated in the light-sensitive layer to promote photoisomerization. Typical classes of sensitizers which are useful in the practice of the present invention include benzothiazoles, pyryliums and thiapyryliums. The photoisomerizable composition can also contain other addenda to accomplish a variety of purposes, such as agents to modify the flexibility of the layer, to modify the surface characteristics, to impart color to the layer, to modify the adhesivity of the layer to its support, and solid particle extenders to decrease the amount of polymer employed. The above addenda can, without particularly affecting photoisomerization, have beneficial effects, for example, increasing adhesion of the layer to its support while on the exterior surface enabling intimate contact between it and the original document during exposure.

Photothermographic elements useful according to the present invention usually comprise a support for the sensitive film. A flexible support is preferred, but any suitable surface for supporting the photothermographic film may be used. Examples of suitable flexible supports include: paper, polyethylene-coated paper, glassine, vegetable parchment, metal foils, polystyrene film, cellulose nitrate film, cellulose acetate film, cellulose acetate butyrate film, cellulose acetate propionate film, and polyester film such as poly(ethylene terephthalate). In some embodiments of this invention a separate support is not utilized, the photoisomerizable compound being carried in a self-supporting polymeric binder. Such support materials can also be utilized as receiving sheets for receiving thermographically transferred images in accordance with transfer processes described herein.

The photoisomerizable composition of our invention is coated on the support in any well known manner, such as extrusion, hopper coating, dip coating, doctor blade coating, etc. In preparing the composition for coating on a support, it is the usual practice to dissolve the components of the composition in a suitable solvent. Suitable coating solvents include hydrocarbon solvents, for example, benzene, toluene, etc.; ketones, such as acetone, 2-butanone, methylethyl ketone, 4-methyl-2-pentanone, etc.; chlorinated hydrocarbons, such as methylene chloride, ethylene chloride, carbontetrachloride, etc.; and the like. In preparing the photothermographic elements of the present invention, a single coating of the photoisomerizable containing composition is normally made onto the support. Alternatively, the layer can be build up of two or more thin coats. The thickness of the photoisomerizable layer can vary over a wide range. For example, a suitable coating thickness can be in the range of about 0.1 to 10 mils. A prefered coating thickness is in the range of 2 to 8 mils.

In the practice of this invention, the photothermographic element is typically exposed to actinic light through a negative for a period sufficient to effect the isomerization of the photoisomerizable compound, thereby forming lower melting image areas where light has been transmitted and higher melting non-image areas where light has been excluded. The imagewise exposed photothermographic element is heated to a temperature above the softening or tackifying point of the light-sensitive material in the image areas to selectively render the exposed areas tacky, but below the softening or tackifying point of the material in the non-image areas. Thus, tackified image areas are obtained which can be developed in a variety of manners. In one embodiment of the invention, the tacky image areas can be developed directly on the photothermographic element by adhering powders having optical density to the tacky areas. In another and preferred embodiment of the invention, the tacky material can be transferred from the image areas to a receiving surface and then developed on the receiving surface while in a tacky state. In yet another embodiment of the invention, material such as a colorant having optical density or capable of forming material having optical density can be incorporated in the photoisomerizable layer, thus yielding a visible image directly upon transfer of the tacky image areas to the receiving surface without further development being necessary.

Optical density can be given to the tacky image by any suitable developer powder which can include practically any pulverizable powder having optical density. Examples include: glycopodium powders, talcum powder, sulfur, carbon black, aluminum bronze powder, etc. Powdered dyes can also be used, or a resin can be used which can be dyed any color desired. Alternatively, the photoisomerizable composition can include a color coupler and coupling agent. On irradiation the coupling color-forming reaction occurs in the areas exposed to light, thus giving a visible image which can be transferred to a receiving sheet. Examples of suitable color formers include: azidobenzimidazole derivatives, phenoxazines, phenothiazines, azides, etc.

The invention is further illustrated by the following examples of preferred embodiments thereof.

EXAMPLE I

A thin sheet of silicated aluminum was coated on one side with a 10 percent by weight solution of trans-2-stilbazole in methyl ethyl ketone. The solvent evaporated to leave a film of large flat crystals. The coated surface was then exposed for 5 minutes through a photographic line negative to light from a 275 watt sun lamp placed 10 inches from the coated surface. After exposure, the aluminum sheet was uniformly heated to 80–82° C. and then pressed against a receiving sheet of office paper stationery. Melted material from exposed areas of the coated surface transferred, forming a printed image on the receiving sheet. Material in unexposed areas of the coated surface remained solid at this temperature and did not transfer.

EXAMPLE II

A solution was prepared by dissolving 2.0 grams of trans-2-stilbazole in 8 grams of methyl ethyl ketone and adding this solution to a solution containing 10 grams of a copolymer of vinyl chloride and vinyl acetate in 40 grams of methyl ethyl ketone. This coating solution was hopper-coated onto a poly(ethylene terephthalate) film base at thicknesses ranging from 0.002 inch to 0.008 inch. When the solvent evaporated, a film of fine, plate-like crystals of trans-2-stilbazole developed in the polymeric binder. The coated surfaces of several sheets were exposed through a photographic line negative to light from a 275 watt sun lamp placed 10 inches from the surface. Exposures of various films ranged from 10 to 15 minutes. A faint, visible image appeared in the exposed areas of the film. The exposed sheets were heated to 90° C. whereupon the image areas of the film became tacky and the background areas remained solid. While still heated, the sheets were pressed against the surface of silicated aluminum receiving sheets and a positive image transferred to the aluminum receiving surface. Up to 4 legible transfer copies were produced by this method from a single coated sheet.

EXAMPLE III

A coating formulation was prepared as described in Example II, but with 0.1 gram of 4-(4-n-amyloxyphenyl)-2,6-bis(4-ethylphenyl)thiapyrylium perchlorate sensitizer added. The formulation was coated on a poly(ethylene terephthalate) film base as described in Example II. The coated film was exposed as in Example II, except that only about 5 minutes exposure was required to produce the same degree of image definition that had required 10 minutes exposure using the unsensitized coating. The sensitizer also produced a yellow color that made it easier to discern the image. Image transfer was effected at 90° C. as in Example II.

EXAMPLE IV

A coating solution was made by adding 2.0 grams of trans-4-styrylpyridine and 8 grams of methyl ethyl ketone to 8.0 grams of a 20 percent solution of a copolymer of vinyl chloride and vinyl acetate in methyl ethyl ketone. The coating solution was hopper-coated on a poly(ethyleneterephthalate) film base using a 0.004 inch hopper. The coated and dried film was exposed as in Example II for 10 minutes. Image transfer was accomplished by heating the exposed film to 120° C. and pressing the heated film against a receiving surface.

EXAMPLE V

A coating solution was made by adding 1.0 gram of trans-2-styrylpyridine to a solution of 10 grams of a butadiene-styrene copolymer in 90 grams of methyl ethyl ketone. A trace of the thiapyrylium sensitizer described in Example III was added just before coating. The coated film was exposed for 10 minutes by the method described in Example II and thermal transfer to a receiving surface was made, with the exposed film heated to 83–85° C. Two clear image transfers were produced from a single matrix.

EXAMPLE VI

A coating solution was prepared containing equal parts of trans-stilbene and copolymer of vinyl chloride and vinyl acetate in methyl ethyl ketone solvent, and was coated as in Example IV on a polyester film base. After drying, the film was exposed to a light pattern for 30 minutes by the method of Example IV and then heated to 92° C. At this temperature material was transferred from the image area of the film to a receiving surface by pressing the heated film against the receiving surface.

EXAMPLE VII

A coating similar to that in Example VI but containing equal weight of trans-p′-ethyl chalcone and a butadiene styrene copolymer was prepared and coated as in Example V. The matrix was exposed to light as in Example II for 10 minutes. A clear image was observed with a crystalline background. Thermal transfers were made by heating the matrix to about 40° C. and transferring material from the image areas to poly(ethylene terephthalate) film base and to aluminum and paper surfaces.

EXAMPLE VIII

A coating solution containing photosensitive color coupling agents was prepared by first dissolving 0.5 gram of 2 - azido - 1 - (N-carbobutoxymethylcarbamyl)benzimidazole and 0.02 gram of benzo(b)phenoxazine with 1.0 gram of trans-2-styrylpyridine in 10 ml. of methyl ethyl ketone and then adding the solution to 5 grams of a 20 percent solution of a copolymer of vinyl chloride and vinyl acetate in methyl ethyl ketone. This dope was hopper-coated on a poly(ethylene terephthalate) film base using a 0.006 inch hopper. After several days the dried surface was entirely covered with a layer of crystals. Exposures were made with a 275 watt sun lamp placed 10 inches from the film surface. Exposures varied in length from 1 to 10 minutes. A brown-violet print-out image was produced in each exposed matrix. Transfers of the colored material in the image areas were made to aluminum, paper, and poly(ethylene terephthalate) film surfaces by pressing the matrix, heated to 90° C., against those surfaces. To facilitate transfer, a roller was used to press the matrix against the receiving surface. In some cases three or more copies were produced from a single matrix.

EXAMPLE IX

A coating solution was prepared as in Example VIII except that a butadiene-styrene copolymer was used as the resin binder and trans-p′-ethyl chalcone was substituted for trans-2-styrylpyridine. Exposure through a line negative to light from a 275 watt sun lamp placed 10 inches from the surface for 10 minutes gave a brown-violet image. Material was transferred from the image areas to a receiving sheet by heating the matrix to about 40° C. and pressing it against a receiving surface.

EXAMPLE X

A coating was prepared as in Example IX except the color-forming coupling agents used were 2-azidobenzoazole and benzo(a)phenothiazine instead of those named in Example VIII. The image produced by exposure was not highly colored but the material was transferred from the image areas at about 40° C.

EXAMPLE XI

A solution containing 0.5 gram of trans-2-styrylfuran in 5 ml. of methyl ethyl ketone was added to 2.5 grams of a 20 percent solution of a copolymer of vinyl chloride and vinyl acetate in methyl ethyl ketone. The solution was hopper-coated on a poly(ethylene terephthalate) film base using a 0.006 inch hopper. After drying, the coating was exposed for 30 minutes through the film base to light from a 275 watt sun lamp placed 10 inches from the film using a photographic line negative. The exposed matrix was heated to 110° C. and material from the image areas of the coated film was transferred at this temperature to a grained aluminum receiving surface.

EXAMPLE XII

A solution containing 1.0 gram of trans-2-styrylthiophene in 10 ml. methyl ethyl ketone was added to 10 ml. of a 10 percent solution of a butadiene-styrene copolymer in methyl ethyl ketone. The resulting solution was hopper-coated on a poly(ethylene terephthalate) film base using a 0.006 inch hopper. After drying, the coating was exposed for 20 minutes through the film base and through a photographic line negative to light from a 275 watt sun lamp placed 10 inches from the film. After exposure the film was heated to 91° C. and material from the image areas was transferred to an aluminum receiver by pressing the coated surface of the matrix firmly against the aluminum receiving surface.

EXAMPLE XIII

Coated sheets were prepared and exposed as in Example II. The exposed sheets were heated to 90° C. and brushed with costyrene black toner particles which adhered only in the melted image areas to produce a visible image. When cooled again to room temperature the image areas hardened, became non-tacky, and the fused toner particles formed a visible image on each sheet.

EXAMPLE XIV

A solution of 1 gram of 2-ethylhexyl-2-cyano-5-(4-nitrophenyl)-2,4-pentadieneoate in 30 ml. of a 10 percent solution of a vinylidene chloride-acrylonitrile copolymer in 2-butanone was added to 15 ml. of a 10 percent solution of poly[tetramethylene terephthalate (30 percent) sebacate (70 percent)] in 2-butanone and the resulting viscous solution was diluted with 15 ml. of 2-butanone. This solution was coated on a polyethylene terephthalate film support and allowed to dry at room temperature. The coated element was exposed through a line negative for 15 seconds in a Blue-Ray printer. Cascade development with a costyrene black powder toner produced a black positive image. The spectral range of this coated material extends from 300–400 mμ. The Blue-Ray printer used in this and subsequent examples is a rotary-type printer using an 18 inch sheathed fluorescent lamp rated at 0.83 watts per inch. During exposure the element passes through the printer at a distance of approximately 1 inch from the sheath.

EXAMPLE XV

A solution prepared from 0.1 gram of bis(2-ethylhexyl) - 5,5′ - (p-phenylene bis (2-cyano-2,4-pentadieneoate), 36 ml. of a 10 percent solution of vinylidene chloride-acrylonitrile copolymer in butanone, 32 ml. of a 10 percent solution of poly[tetramethylene terephthalate (30 percent) sebacate (70 percent)] in 2-butanone, and 32 ml. of a 2-butanone was coated on film and paper backing supports at a wet thickness of 0.002-inch, which corresponds to approximately 0.001 gram of photosensitive material per square foot of coverage. Spectral response of this material ranges from 320–500 mμ. A sample of this coating on a paper base was exposed through a negative for 10 seconds to a 250 watt Photoflood Lamp at a distance of 8 inches and then was cascade developed with a costyrene black powder toner to obtain a black positive image.

EXAMPLE XVI

A solution of 0.1 gram of 2-ethylhexyl 2-cyano-5-(2-furyl)-2,4-pentadieneoate in 3 ml. of a 10 percent solution of a vinylidene chloride-acrylonitrile copolymer in 2-butanone was added to 1.5 ml. of a 10 percent solution of poly[tetramethylene terephthalate (30) sebacate (70)] in 2-butanone, and the resulting viscous solution was diluted with 5 ml. of 2-butanone. This solution was coated on film and paper base supports and allowed to dry at room temperature. A coated element was exposed through a line negative for 30 seconds in a Blue-Ray printer. Cascade development with a costyrene black powder toner produced a black positive image.

EXAMPLE XVII

A solution was prepared from 0.05 gram of diethyl 5,5′-(p-phenylene) bis (2,4-pentadieneoate), 9 ml. of a 10 percent solution of a vinylidene chloride-acrylonitrile copolymer in 2-butanone, 8 ml. of a 10 percent solution of poly[tetramethylene terephthalate (30) sebacate (70)] in 2-butanone, and 8 ml. of 2-butanone. The resulting solution was coated on poly(ethylene terephthalate) and polyethylene films at a wet thickness of 0.002 inch. A sample of the coating on poly(ethylene terephthalate) film support was exposed on an Ozalid Ozamatic printer at a speed of 30 feet per minute and cascade developed with a costyrene black powder toner to obtain a black positive image. The Ozalid Ozamatic printer used in this and subsequent examples is a belt fed printer containing a 1200 watt high pressure mercury lamp rated at 75 watts per inch of bulb. During exposure the element is irradiated through a diffusion glass at a distance of approximately 1 inch.

EXAMPLE XVIII

A solution was prepared from 0.025 gram of bis-(2-ethylhexyl) - 7,7′ - (p-phenylene) bis(2-cyano-2,4,6-heptatrieneoate), 9 ml. of a 10 percent solution of a vinylidene chloride-acrylonitrile copolymer in 2-butanone, 8 ml. of a 10 percent solution of poly[tetramethylene terephthalate (30) sebacate (70)] in 2-butanone, and 8 ml. of 2-butanone. This solution was coated on poly(ethylene terephthalate) film support at a wet thickness of 0.002 inch. The resulting dry coating was exposed through a line negative in an Ozalid Ozamatic printer at a speed of 30 feet per minute and then was cascade developed with a costyrene black powder toner to obtain a black positive image.

EXAMPLE XIX

A solution was prepared from 0.05 gram of 2-ethyloctyl 4-(β-benzoylvinyl)cinnamate in 10 ml. of 2-butanone. This solution was coated on poly(ethylene terephthalate) film support at a wet thickness of 0.002 inch and on polyethylene film at a wet thickness of 0.004 inch. After a short drying period the surfaces of the coatings were rubbed lightly to initiate crystallization. The resulting coatings were exposed through a negative on an Ozalid Ozamatic Printer at a speed of 30 feet per minute and then were cascade developed with a costyrene black powder toner to obtain a black positive image. The spectral range of this material extends from 300 to 380 mμ.

EXAMPLE XX

The solution of Examples XV was coated on paper and was then exposed through a negative for 8 seconds to a 275 watt sun lamp placed 10 inches from the surface. The coated paper was then immersed in a dye bath containing an aqueous solution of p-rosaniline hydrochloride containing a small amount of ethyl alcohol. A positive dye image was obtained with the dye solution adhering to the exposed areas. The resulting print can be employed as a dye transfer or spirit duplicating matrix, the dye being transferred to a damp receiving sheet to obtain up to 4 copies before redying of the matrix is necessary.

EXAMPLE XXI

The solution of Example XV was coated on a film support and was then exposed for 30 seconds through a line negative in a Blue-Ray printer. The coated film was then immersed in an ethanolic solution of silver nitrate, it was then dried and placed under a 275 watt sun lamp at a distance of 10 inches for 5 minutes to obtain a positive silver print-out image.

EXAMPLE XXII

The solution of Example XV was coated on a paper support and was exposed through a line negative for 10 seconds to a 275 watt sun lamp at a distance of 10 inches. It was then cascade developed with copper powder to obtain a positive copper image. The resulting copper image was an electrical conductor.

EXAMPLE XXIII

Trans-2-stilbazole was dissolved to a 4 percent solution in methyl ethyl ketone and this solution was coated on an 8-inch wide strip of polyethylene coated paper at a coverage of 0.7 g. per square foot. The coated solution dried to form a mass of large flat crystals of trans-2-stilbazole. Over a part of the coated area was laminated a sheet of 400 mesh rayon fabric by means of heating and pressure. A sample having areas with the porous permeable layer and also areas without the porous permeable layer was exposed through a line negative to light from a 275 watt sun lamp for 5 minutes at a distance of 10 inches. The coated side was placed in contact with plain white calendered paper stock and passed through the nip of steel rolls at 85° C. Six successive transfers were made from the same sample. From areas covered by the porous permeable layer, the transfer images were of more even density from one copy to the next and more copies of legible quality were obtained than from the areas not having a porous permeable outer layer.

The above example demonstrates the use of a porous permeable overcoat which can be provided to meter the transfer of tacky material from the element to the receiving sheet. Such an overcoat regulates transfer of tacky material from the element to the receiving sheet thus permitting a greater number of more uniform copies to be made. It also allows the use of thicker coatings of photoisomerizable material to be employed without the loss of image definition. Moreover, it prevents sticking of the photothermographic element to the receiving sheet during transfer. In addition to the material exemplified above, overcoats suitable in practice of the present invention can be prepared from materials including polyvinyl alcohol, alumina fibrils, gelatin, etc. Preparation and coating of these overcoats is described in U.S. Patent No. 3,260,612.

Although this invention has been described in considerable detail with particular reference to preferred embodiments thereof, modifications and variations can be effected within the spirit and scope of the invention as described above and as defined in the following claims.

We claim:

1. A photosensitive element for use in photothermographic reproduction processes which comprises a support and a layer of a photoisomerizable compound which has the property of undergoing transition when exposed to actinic radiation to a geometric isomer that has a softening point substantially lower than the softening point of the photoisomerizable compound, said photoisomerizable compound having the formula:

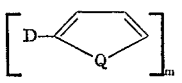

where $m$ is an integer of 1 to 2; Q is selected from the group consisting of —CH=CH—, —S—, —O—, and >N–R radicals, R is selected from the group consisting of hydrogen atoms and lower alkyl groups; D is a $$R''-\overset{R'''}{\overset{|}{C}}=\underset{\underset{R'}{|}}{C}(CH=CH)_n-$$

radical, where $n$ is an integer of 0 to 2, R′ is selected from the group consisting of hydrogen atoms and lower alkyl groups, R″ is selected from the group consisting of chlorocarbonyl, alkyloxycarbonyl, cyano, azidocarbonyl and aryl radicals, and heterocyclic radicals having a nucleus of 5 to 6 atoms at least one of which is selected from the group consisting of N, S and O atoms, R‴ is selected from the group consisting of hydrogen atoms, cyano radicals and lower alkyl radicals; when $m$ is 2 each D is joined by a single covalent bond; and E is selected from the group consisting of hydrogen atoms, lower alkyl, nitro and D radicals.

2. A photothermographic element as defined in claim 1 wherein said layer of material comprises a mixture of said photoisomerizable compound and a thermoplastic polymer that with said photoisomerizable compound forms a non-tacky mixture, and that with said isomer forms a thermoplastic mixture that softens at a temperature substantially below the softening point of said mixture of polymer and photoisomerizable compound.

3. A photographic element as defined in claim 1 wherein said photoisomerizable compound has the formula:

$$\left[R_1O\overset{O}{\overset{\|}{C}}-(\overset{R_2}{\overset{|}{C}}=\overset{R_3}{\overset{|}{C}}-)_m\right]_n Z$$

where $R_1$ is an alkyl radical; $R_2$ and $R_3$ are each selected from the group consisting of hydrogen atoms, cyano and lower alkyl radicals; Z is selected from the group consisting of aryl radicals and heterocyclic radicals having a nucleus of 5 to 6 atoms at least one of which is selected from the group consisting of N, S, and O; $n$ is an integer of 1 to 2 and $m$ is an integer of 1 to 5; when $n$ is 1, Z is monovalent, and when $n$ is 2, Z is divalent.

4. A photothermographic element as defined in claim 3 wherein said layer comprises a mixture of said photoisomerizable compound and a thermoplastic polymer that with said photoisomerizable compound forms a non-tacky mixture, and that with said isomer forms a thermoplastic mixture that softens at a temperature substantially below the softening point of said mixture of polymer and photoisomerizable compound.

5. A photothermographic element as defined in claim 2 wherein the ratio of photoisomerizable compound to thermoplastic polymer is from 1 to 0.2 to 1 to 70.

6. A photothermographic element as defined in claim 2 wherein the thermoplastic polymer is a copolymer of vinyl chloride and vinyl acetate.

7. A photothermographic element as defined in claim 2 wherein the thermoplastic polymer is a copolymer of butadiene and styrene.

8. The thermographic element as defined in claim 4 wherein the thermoplastic polymer is a mixture of a vinylidene chloride-acrylonitrile copolymer and a poly(tetramethylene terephthalate-sebacate) copolymer.

9. A photothermographic element as defined in claim 4 wherein said photoisomerizable compound is bis(2-ethylhexyl)5,5′-(p-phenylene)bis(2-cyano-2,4-pentadieneoate).

10. A photothermographic coated element as defined in claim 4 wherein said photoisomerizable compound is bis(2-ethylhexyl) 7,7′-(p-phenylene)bis(2-cyano-2,4,6-heptatrieneoate).

11. A photothermographic coated element as defined in claim 4 wherein said photoisomerizable compound is 2-ethylhexyl 2-cyano-5-(4-nitrophenyl)-2,4-pentadieneoate.

12. A photothermographic coated element as defined in claim 4 wherein said photoisomerizable compound is 2-ethylhexyl 2-cyano-5-(2-furyl)-2,4-pentadieneoate.

13. A photothermographic coated element as defined in claim 4 wherein said photoisomerizable compound is diethyl 5,5'-(p-phenylene)bis(2,4-pentadieneoate).

14. A photothermographic element as defined in claim 2 wherein said element further comprises a porous layer over said photoisomerizable compound permeable to said isomer in its tacky state.

15. A process comprising the steps of: (1) exposing to actinic radiation selected areas of a solid non-tacky layer comprising a photoisomerizable compound that undergoes transition upon such exposure to an isomeric form having a substantially reduced melting point thereby forming exposed and unexposed areas in said layer having substantially different melting points, said photoisomerizable compound having the formula:

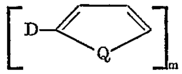

where $m$ is an integer of 1 to 2; Q is selected from the group consisting of —CH=CH—, —S—, —O— and >N—R radicals, R being selected from the group consisting of hydrogen atoms and lower alkyl groups; D is a $$R''-\overset{R'''}{\overset{|}{C}}=\underset{\underset{R'}{|}}{C}(CH=CH)_n-$$

radical, where $n$ is an integer of 0 to 2, R' being selected from the group consisting of hydrogen atoms and lower alkyl groups, R'' being selected from the group consisting of chlorocarbonyl, alkoxy-carbonyl, cyano, azidocarbonyl, aryl radicals, and heterocyclic radicals having a nucleus of 5 to 6 atoms at least one of which is selected from the group consisting of N, S, and O atoms, R''' being selected from the group consisting of hydrogen atoms, cyano radicals and lower alkyl radicals; when $m$ is 2 each D is joined by a single covalent bond; E is selected from the group consisting of hydrogen atoms, lower alkyl, nitro and D radicals, and (2) heating said layer to a temperature higher than the softening point of the lower melting exposed areas of said layer and below the softening point of the higher melting unexposed areas, thereby selectively forming a softened image in said exposed areas.

16. A process as defined in claim 15 wherein said layer is heated to a temperature between 40° C. and 200° C.

17. The process as defined in claim 15 wherein said softened material is transferred from said exposed areas of the layer to a receiving sheet and toned with a toner powder having optical density.

18. The process as defined in claim 17 wherein said photoisomerizable compound has the formula:

$$\left[R_1O\overset{O}{\overset{\|}{C}}-(\overset{R_2}{\overset{|}{C}}=\overset{R_3}{\overset{|}{C}}-)_m\right]_n Z$$

where $R_1$ is an alkyl radical, $R_2$ and $R_3$ are each selected from the group consisting of hydrogen atoms, cyano and lower alkyl radicals; Z is selected from the group consisting of aryl radicals and heterocyclic radicals having a nucleus of 5 to 6 atoms at least one of which is selected from the group consisting of N, S, and O; $n$ is an integer of 1 to 2 and $m$ is an integer of 1 to 5; when $n$ is 1, Z is monovalent, and when $n$ is 2, Z is divalent.

19. A photothermographic element as defined in claim 2 wherein said layer further comprises a sensitizer selected from the group consisting of pyrylium salts and thiapyrylium salts.

20. A photothermographic element as defined in claim 19 wherein said sensitizer is 4-(4-n-amyloxyphenyl)-2,6-bis(4-ethylphenyl)thiapyrylium perchlorate.

References Cited

UNITED STATES PATENTS

| | | | |
|---|---|---|---|
| 1,782,259 | 11/1930 | Eggert | 96—48 |
| 1,965,710 | 7/1934 | Murray | 96—115 |
| 3,387,974 | 6/1968 | Dulmage et al. | 96—28 |

NORMAN G. TORCHIN, Primary Examiner

RONALD H. SMITH, Assistant Examiner

U.S. Cl. X.R.

96—48, 88, 115

(5/69)

CERTIFICATE OF CORRECTION

Patent No. 3,487,764 Dated January 6, 1970

Inventor(s) Douglas G. Borden and Jack L. R. Williams

It is certified that error appears in the above-identified patent and that said Letters Patent are hereby corrected as shown below:

Column 9, lines 73-75, the formula reading " 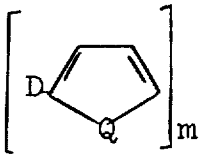 "

should read --- 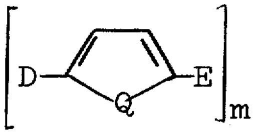 ---;

column 11, lines 18-21, the formula reading " 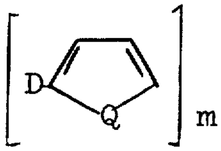 "

should read --- 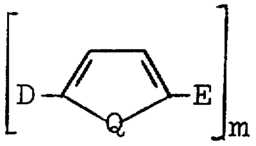 ---.

SIGNED AND SEALED

JUN 16 1970

(SEAL)
Attest:

Edward M. Fletcher, Jr.
Attesting Officer

WILLIAM E. SCHUYLER, JR.
Commissioner of Patents